United States Patent
Zheng et al.

(10) Patent No.: US 9,034,149 B2
(45) Date of Patent: May 19, 2015

(54) METHOD FOR FABRICATING A HIGH COERCIVITY HARD BIAS STRUCTURE FOR MAGNETORESISTIVE SENSOR

(75) Inventors: Min Zheng, Milpitas, CA (US); Kunliang Zhang, Fremont, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1112 days.

(21) Appl. No.: 12/387,377

(22) Filed: May 1, 2009

(65) Prior Publication Data
US 2010/0276272 A1    Nov. 4, 2010

(51) Int. Cl.
| | |
|---|---|
| C23C 14/58 | (2006.01) |
| C23C 14/14 | (2006.01) |
| C23C 14/02 | (2006.01) |
| G01R 33/09 | (2006.01) |
| G11B 5/31 | (2006.01) |
| G11B 5/39 | (2006.01) |

(52) U.S. Cl.
CPC ......... *C23C 14/5833* (2013.01); *C23C 14/5873* (2013.01); *C23C 14/14* (2013.01); *C23C 14/025* (2013.01); *G01R 33/098* (2013.01); *G11B 5/3163* (2013.01); *G11B 5/3932* (2013.01)

(58) Field of Classification Search
CPC C23C 14/5833; C23C 14/5873; C23C 14/14; C23C 14/025; G01R 33/098; G11B 5/3163; G11B 5/3932
USPC .................... 204/192.15, 12.2, 192.35, 192.2
See application file for complete search history.

(56) References Cited

U.S. PATENT DOCUMENTS

| | | | | |
|---|---|---|---|---|
| 5,492,605 | A * | 2/1996 | Pinarbasi | 204/192.11 |
| 6,478,931 | B1 * | 11/2002 | Wadley et al. | 204/192.12 |
| 7,016,165 | B2 * | 3/2006 | Chien et al. | 360/324.12 |
| 7,194,797 | B2 * | 3/2007 | Pinarbasi | 29/603.14 |
| 7,360,299 | B2 * | 4/2008 | Carey et al. | 29/603.16 |
| 7,848,065 | B2 * | 12/2010 | Freitag et al. | 360/324.12 |
| 2002/0015268 | A1 | 2/2002 | Mao et al. | |
| 2006/0000078 | A1 | 1/2006 | Pinarbasi | |
| 2006/0087772 | A1 | 4/2006 | Pinarbasi | |
| 2007/0035893 | A1 | 2/2007 | Freitag et al. | |
| 2008/0151441 | A1 | 6/2008 | Freitag et al. | |

FOREIGN PATENT DOCUMENTS

| | | | |
|---|---|---|---|
| JP | 08329458 A | * | 12/1996 |
| JP | 2008-267863 | | 11/2008 |
| JP | 2009-087474 | | 4/2009 |

OTHER PUBLICATIONS

Machine Translation—JP 08329458.*
Japanese Office Action 2010-106418 Mailed: Aug. 4, 2014, Headway Technologies Inc.

* cited by examiner

Primary Examiner — Michael Band
(74) Attorney, Agent, or Firm — Saile Ackerman LLC; Stephen B. Ackerman

(57) ABSTRACT

A hard bias (HB) structure for longitudinally biasing a free layer in a MR sensor is disclosed that includes a mildly etched seed layer and a hard bias (HB) layer on the etched seed layer. The HB layer may contain one or more HB sub-layers stacked on a lower sub-layer which contacts the etched seed layer. Each HB sub-layer is mildly etched before depositing another HB sub-layer thereon. The etch may be performed in an IBD chamber and creates a higher concentration of nucleation sites on the etched surface thereby promoting a smaller HB average grain size than would be realized with no etch treatments. A smaller HB average grain size is responsible for increasing Hcr in a CoPt HB layer to as high as 2500 to 3000 Oe. Higher Hcr is achieved without changing the seed layer or HB material and without changing the thickness of the aforementioned layers.

17 Claims, 3 Drawing Sheets

METHOD FOR FABRICATING A HIGH COERCIVITY HARD BIAS STRUCTURE FOR MAGNETORESISTIVE SENSOR

FIELD OF THE INVENTION

The invention relates to a method for achieving a hard bias (HB) structure with high coercivity that is necessary to stabilize the magnetization in an adjacent free layer in thin film magneto-resistive (MR) sensors.

BACKGROUND OF THE INVENTION

In a magnetic recording device in which a read head is based on a spin valve magnetoresistance (SVMR) or a giant magnetoresistance (GMR) effect, there is a constant drive to increase recording density. One method of accomplishing this objective is to decrease the size of the sensor element in the read head that is suspended over a magnetic disk on an air bearing surface (ABS). The sensor is a critical component in which different magnetic states are detected by passing a sense current through the sensor and monitoring a resistance change. A GMR configuration includes two ferromagnetic layers which are separated by a non-magnetic conductive layer in the sensor stack. One of the ferromagnetic layers is a pinned layer wherein the magnetization direction is fixed by exchange coupling with an adjacent anti-ferromagnetic (AFM) pinning layer. The second ferromagnetic layer is a free layer wherein the magnetization vector can rotate in response to external magnetic fields. In the absence of an external magnetic field, the magnetization direction of the free layer is aligned perpendicular to that of the pinned layer by the influence of hard bias layers on opposite sides of the sensor stack. When an external magnetic field is applied by passing the sensor over a recording medium at the ABS, the free layer magnetic moment may rotate to an opposite direction. Alternatively, in a tunneling magnetoresistive (TMR) sensor, the two ferromagnetic layers are separated by a thin non-magnetic dielectric layer.

A sense current is used to detect a resistance value which is lower in a (0) memory state than in a (1) memory state. In a CPP configuration, a sense current is passed through the sensor in a direction perpendicular to the layers in the sensor stack. Alternatively, there is a current-in-plane (CIP) configuration where the sense current passes through the sensor in a direction parallel to the planes of the sensor layers.

Ultra-high density (over 100 Gb/in$^2$) recording requires a highly sensitive read head in which the cross-sectional area of the sensor is typically smaller than 0.1×0.1 microns at the ABS plane. Current recording head applications are typically based on an abutting junction configuration in which a hard bias layer is formed adjacent to each side of a free layer in a GMR spin valve structure. As the recording density further increases and track width decreases, the junction edge stability becomes more important so that edge demagnification in the free layer needs to be reduced. In other words, horizontal (longitudinal) biasing is necessary so that a single domain magnetization state in the free layer will be stable against all reasonable perturbations while the sensor maintains relatively high signal sensitivity.

In longitudinal biasing read head design, hard bias films of high coercivity are abutted against the edges of the sensor and particularly against the sides of the free layer. In other designs, there is a thin seed layer between the hard bias layer and free layer. By arranging for the flux flow in the free layer to be equal to the flux flow in the adjoining hard bias layer, the demagnetizing field at the junction edges of the aforementioned layers vanishes because of the absence of magnetic poles at the junction. As the critical dimensions for sensor elements become smaller with higher recording density requirements, the free layer becomes more volatile and more difficult to bias which means the minimum longitudinal bias field necessary for free layer domain stabilization must be increased.

Imperfect alignment with a hard magnetic thin film such as a free layer can give rise to hysteresis or non-linear response of the sensor and thus noise. In general, it is desirable to enhance the coercivity of the hard bias film so that the stray field created by the recording medium will not destroy the magnetic alignment of the free layer. A high coercivity in the in-plane direction is needed in the hard bias layer to provide a stable longitudinal bias that maintains a single domain state in the free layer and thereby avoids undesirable Barkhausen noise. This condition is realized when there is a sufficient in-plane remnant magnetization ($M_r$) from the hard bias layer which may also be expressed as $M_r t$ since hard bias field is also dependent on the thickness (t) of the hard bias layer. $M_r t$ is the component that provides the longitudinal bias flux to the free layer and must be high enough to assure a single magnetic domain in the free layer but not so high as to prevent the magnetic field in the free layer from rotating under the influence of a reasonably sized external magnetic field. Moreover, a high squareness (S) hard bias material is desired. In other words, $S=M_r/M_S$ should approach 1 where $M_S$ represents the magnetic saturation value of the hard bias material. A higher $M_r$ will advantageously allow t to be smaller for advanced designs with high recording density. p Many efforts have been made to achieve higher coercivity in hard bias films and the improvement is generally realized through altering the composition of an underlying seed layer. U.S. Patent Appl. Publication 2008/0151441 describes a Ta or Cr seed layer that is ion milled to form an anisotropic surface texture under the hard bias layer to increase coercivity. In U.S. Patent Appl. Publication 2002/0015268, a composite seed layer having a Cr/TiW stack with a 50 Angstrom thickness for each layer is employed to raise Hc for an overlying CoPt hard bias layer to 2300 Oe from 1800 Oe with a conventional Cr seed layer/CoPt hard bias layer configuration. Similarly, U.S. Patent Appl. Publication 2006/0087772 discloses a NiTa (10 A)/CrMo (40 A) seed layer that increases coercivity of an overlying CoPt hard bias layer to 2000 Oe. It should be understood that the magnetostatic coupling provided by a hard bias layer drops off quickly with increased spacing between the hard bias layer and free layer. In addition, it is important not to adjust the thickness of the hard bias layer since the thickness value is more or less set based on the design requirement for the sensor. Changing the thickness of the hard bias layer might require adjusting the thickness of one or more layers in the sensor which could degrade performance. Therefore, an improved hard bias structure is needed in which the coercivity of the hard bias layer can be increased by using existing materials and without changing the thickness of the seed layer and hard bias layer.

SUMMARY OF THE INVENTION

One objective of the present invention is to provide a hard bias layer with greater coercivity that enables magnetization stabilization in an adjacent free layer within a magnetoresistive sensor capable of high recording density.

A second objective of the present invention is to provide a method of increasing the coercivity in a hard bias layer without changing the elemental composition or thickness of the hard bias layer or underlying seed layer.

According to one aspect of the present invention, these objectives are achieved by a magnetic sensor that includes a free layer with a magnetic moment aligned in a certain direction that may be along an easy axis. The magnetic sensor has a top surface, a bottom surface formed on a substrate, and sidewalls connecting the top and bottom surfaces. The substrate may be a first gap layer in a read head, for example. From a top view, the top surface of the sensor may have a circular, elliptical, or polygonal shape with an area that is related to the device density. As the area size shrinks, a greater device density is enabled for advanced technologies. There is a seed layer disposed on the substrate and along the sidewalls of the sensor that covers exposed portions of the free layer. A hard bias layer made of CoPt or a CoPt alloy such as CoCrPt is formed on the seed layer and has high coercivity of greater than about 2000 Oe to stabilize the magnetization of the free layer. The bias field strength on the free layer is maximized by forming the hard bias layer proximate to all exposed surfaces of the free layer along the sidewalls. Hard bias coercivity is greater than achieved in prior art because a substantial portion of the hard bias layer is comprised of smaller grain sizes than previously formed by conventional methods.

In one embodiment, smaller grain size in the hard bias layer is achieved by surface roughening the seed layer using a mild etching process that involves Ar ions or other inert gas ions. The mild etch may be performed in an ion beam deposition (IBD) chamber to remove about 5 to 10 Angstroms of seed layer and in so doing creates a higher density of nucleation sites. The nucleation sites have a higher surface energy than other regions of the seed layer surface thereby promoting a small grain size during subsequent deposition of the hard bias layer which may be formed in a single deposition step. It is observed by TEM cross-section analysis that the small grain size is about 30% to 40% less than achieved by conventional deposition methods.

According to a second embodiment, the hard bias layer may be deposited as a plurality of sub-layers. An important feature is that each sub-layer is treated with the mild etching process before a subsequent sub-layer is formed. The mild etch treatment of hard bias sub-layers may comprise the same IBD process conditions as used to produce surface roughening in the underlying seed layer. Thus, a top portion in each sub-layer is removed by bombardment with Ar ions or other inert gas ions to generate an increased density of nucleation sites before the next sub-layer is laid down. The average grain size is smaller than that formed by a conventional deposition method and provides a higher coercivity than in the prior art.

To complete the sensor, a first lead that is electrically connected to a cap layer above the free layer may be formed on the hard bias layer along one sidewall, and a second lead that is electrically connected to the cap layer may be formed on the hard bias layer along a sidewall opposite the first lead. Thereafter, a second gap layer may be formed on the first and second leads and on the top surface of the sensor structure.

DETAILED DESCRIPTION OF THE INVENTION

The present invention is an improved hard bias structure in a magnetic read head and a method for forming the same that enhances the hard bias field strength for longitudinal biasing of a free layer in an adjacent sensor stack. Although the exemplary embodiments depicts a bottom spin valve in the sensor stack, those skilled in the art will appreciate that the present invention may also apply to top spin valves or multi-layer spin valves in sensor designs based on a GMR or TMR effect. The drawings are provided by way of example and are not intended to limit the scope of the invention.

Figure 1:
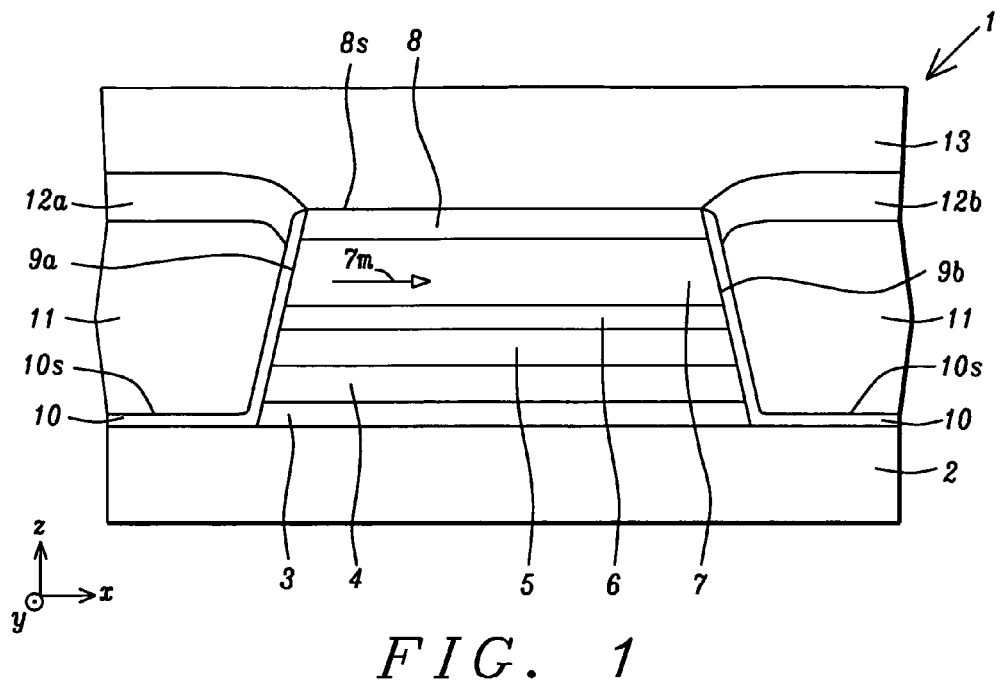
FIG. 1 is a cross-sectional view showing a magnetic read head having a free layer in a sensor stack that is stabilized by a hard bias layer formed according to one embodiment of the present invention.

Referring to FIG. 1, a sensor stack in a read head structure 1 is shown as viewed from an air bearing surface (ABS) plane. A first gap layer 2 made of an insulator material such as alumina is typically formed on a bottom shield (not shown). Above the first gap layer 2 is a sensor structure comprised of a ferromagnetic free layer, pinned layer, and a spacer between the free layer and pinned layer. In the exemplary embodiment, the sensor has a bottom spin valve configuration in which a seed layer 3, anti-ferromagnetic (AFM) layer 4, pinned layer 5, a non-magnetic spacer or tunnel barrier 6, a free layer 7, and a capping layer 8 are sequentially formed on the first gap layer 2. The sensor stack of layers is patterned by a well known method to form a bottom surface contacting the first gap layer 2, a top surface 8s, and sidewalls 9a, 9b on opposite sides of the sensor. The sidewalls 9a, 9b may be essentially vertical or have a slope with respect to the z-axis. Free layer 7 is comprised of one or more ferromagnetic layers such as CoFe/NiFe having a magnetic moment 7m aligned in a direction parallel to the x-axis. Pinned layer 5 is depicted as a single layer but may have a synthetic anti-ferromagnetic (SyAF) configuration where two ferromagnetic layers having magnetizations in opposite directions (not shown) are separated by coupling layer such as Ru. The one or more ferromagnetic layers within pinned layer 5 may be comprised of CoFe or alloys thereof, for example. The non-magnetic spacer 6 may be Cu in a GMR configuration. Alternatively, a TMR sensor may include a tunnel barrier layer 6 made of MgO, AlOx, or other insulator materials.

An important feature according to a first embodiment of the present invention is a hard bias structure comprised of seed layer 10 and hard bias layer 11 formed on opposite sides of the sensor structure wherein the seed layer contacts the sensor sidewalls 9a, 9b including exposed portions of free layer 7. The hard bias structure described herein is designed to have a high coercivity in order to stabilize the magnetization of the free layer 7 along an easy axis which is depicted as the (+) or (−) x-axis direction. Preferably, the coercivity of the hard bias layer 11 is substantially greater than 2000 Oe, and more preferably, greater than or equal to about 2300 Oe in order to stabilize a free layer 7 in a sensor, especially in designs where a small sensor is required to meet requirements for a high areal recording density. For example, the hard bias structure prevents stray magnetic fields generated by a magnetic medium from inadvertently switching the magnetization direction of the free layer.

The seed layer 10 has a thickness between 10 and 100 Angstroms, and preferably about 40 Angstroms, and may be comprised of Ti, TiW, CrTi, Cr, CrMo, CrW, CrV, or the like. Seed layer 10 is deposited by an ion beam or magnetron sputter deposition method and essentially conforms to the shape of the substrate (first gap layer 2) and sidewalls 9a, 9b.

When an IBD system is employed for depositing the seed layer 10, the deposition angle may be varied. For instance, a first step may involve a high deposition angle while a second step employs a low deposition angle. The deposition processes of the seed layer, and HB layer are generally performed with a photoresist mask (not shown) on the top of the patterned sensor stack. To minimize the overspray, a shaper may be used in IBD systems. Typically, the photoresist mask is removed after the hard bias layer 11 is formed. In the exemplary embodiment, the hard bias layer 11 may be comprised of CoPt, CoCrPt, or an alloy thereof, for example, and has an essentially planar top surface. In one aspect, the hard bias layer may have a top surface coplanar with top surface 8s. In order to planarize the hard bias layer 11, a mild chemical mechanical polish (CMP) process may be employed. The thickness of the hard bias layer 11 may be from 50 to 400 Angstroms depending on the design requirement for the adjacent sensor structure.

Figure 5:
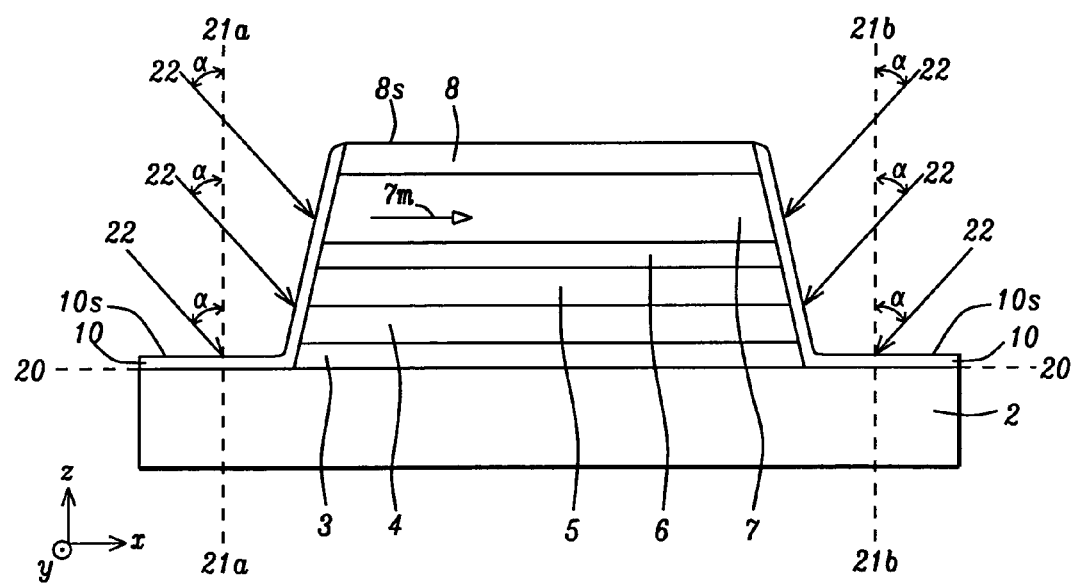
FIG. 5 is a cross-sectional view of the etching process of a seed layer prior to depositing a hard bias layer according to an embodiment of the present invention.

According to a method of the present invention, a key feature in forming a hard bias structure with a seed layer/hard bias layer configuration is that the seed layer 10 is treated with a mild etching process after deposition in order to create a higher density of nucleation sites at the surface 10s than is formed by a deposition process. Nucleation sites are known to have a higher surface energy than other portions of the surface 10s and thereby promote crystal growth during a subsequent hard bias layer 11 deposition. The etching process is preferably performed in the same IBD chamber employed for depositing the seed layer and comprises an inert gas such as Ar with a flow rate of about 10 to 15 standard cubic centimeters per minute (sccm), a beam voltage of about 100 to 300 volts, and a beam current of 50 to 200 milli-Amps for a period of approximately 10 to 30 seconds. The beam angle α is between 0 and 30 degrees with respect to a plane 21a-21a (or 21b-21b) that is perpendicular to the plane 20-20 of the gap layer 2 as depicted in FIG. 5. As a result, a top portion of the seed layer about 5 to 10 Angstroms thick is removed as the seed layer surface is roughened during ion bombardment 22.

Seed layer 10 is preferably crystalline with a body centered cubic (bcc) lattice configuration in order to promote a bcc epitaxy growth through lattice matching in the subsequently deposited hard bias layer 11. We have discovered that mild etching of the seed layer 10 is critical in enabling a smaller grain size in the hard bias layer 11 than would otherwise be formed in a conventional hard bias layer deposition. The size of CoPt or CoCrPt grains formed on an etched seed layer according to the present invention is about 30% to 40% smaller than the grain size formed on an untreated seed layer as estimated from a high resolution TEM cross-sectional view. Moreover, the grain size distribution is substantially narrower than that formed by a conventional method. Smaller grain size is an advantage because larger grains formed by conventional methods have a tendency to coalesce to form very large grains in which the magnetic moment can rotate to effectively diminish the remanece coercivity (Hcr). On the other hand, grain size in hard bias layer 11 is not reduced to such an extent that leads to undesirable paramagnetic behavior. In other words, growth of a hard bias grain size that is intermediate between a super fine size having paramagnetic behavior and a large size formed by a conventional deposition process is responsible for an enhanced Hcr that improves longitudinal bias stabilization of the adjacent free layer magnetization in the sensor stack.

There is a lead 12a formed on hard bias layer 11 and adjacent to sidewall 9a and a lead 12b formed on hard bias layer 11 and adjacent to sidewall 9b that provide an electrical connection to cap layer 8. Although the leads 12a, 12b are shown contacting the seed layer 11 along sidewalls 9a, 9b, respectively, the leads may also contact the top surface 8s proximate to sidewalls 9a, 9b. It should be understood that the length of the top surface 8s between the leads 12a, 12b determines the track width of the sensor. A second gap layer 13 preferably comprised of the same material as in first gap layer 2 is formed on top surface 8s and on leads 12a, 12b. A top shield (not shown) may be disposed on the second gap layer 13 to complete the read head structure 1.

Figure 3:
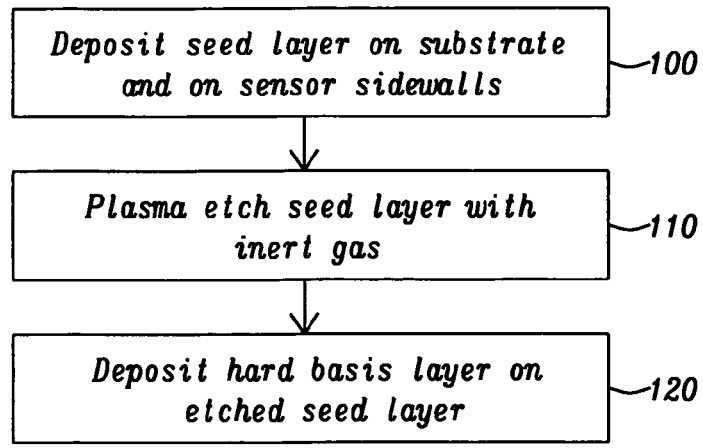
FIG. 3 is a flow chart illustrating a process sequence for depositing a seed layer, lightly etching the seed layer, and then deposited the hard bias layer according to one embodiment of the present invention.

The process flow for depositing a hard bias structure according to the first embodiment of the present invention is shown in FIG. 3. In step 100, a seed layer is deposited on a substrate such as a first gap layer and on the sidewalls of a patterned sensor structure formed on the substrate. In the following step 110, the seed layer is plasma etched to remove about 5 to 10 Angstroms from the top surface of the seed layer and in so doing create a higher density of nucleation sites on the seed layer surface than would otherwise be formed during a typical seed layer deposition. It should be understood that nucleation sites have a higher surface energy than other regions on the seed layer surface. During step 120, a hard bias layer is deposited on the etched seed layer. It is believed that a higher number of nucleation sites on the seed layer surface formed during step 120 is responsible for formation of a smaller average grain size in a subsequently deposited hard bias layer. From a high resolution TEM cross-sectional view (not shown), the interface between the etched seed layer and hard bias layer can be easily identified. Steps 100, 110, and 120 may be performed in the same IBD chamber to optimize throughput.

Figure 2:
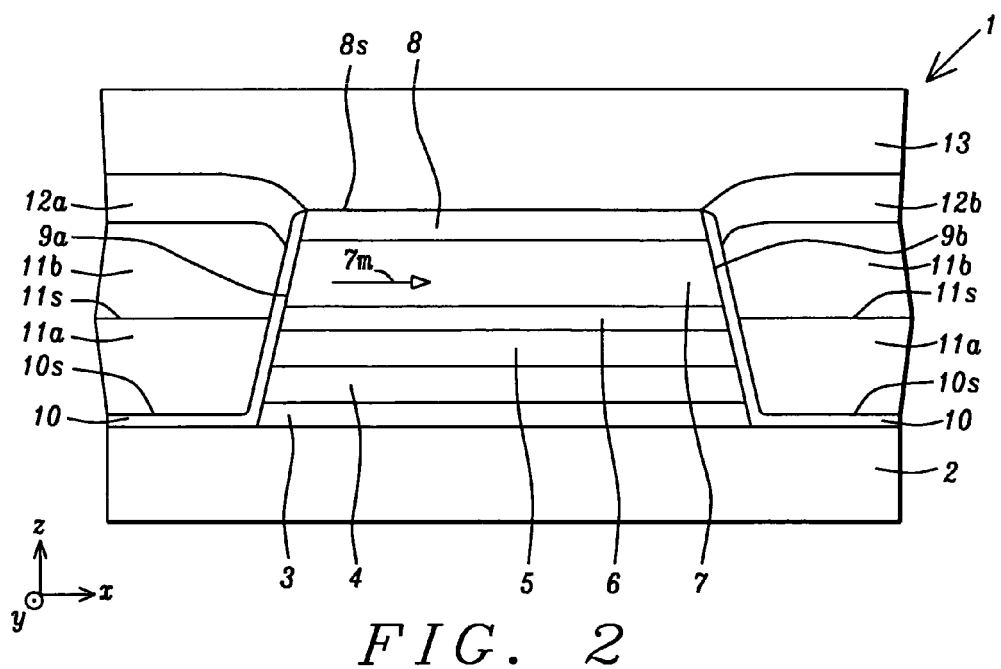
FIG. 2 is a cross-sectional view of a magnetic read head having a free layer in a sensor stack stabilized by a hard bias layer comprised of a plurality of sub-layers and formed according to a second embodiment of the present invention.

Referring to FIG. 2, a second embodiment of the present invention is illustrated. The hard bias structure in the first embodiment is modified by forming a plurality of hard bias sub-layers on seed layer 10. In one aspect, the hard bias layer 11 is comprised of two hard bias sub-layers 11a, 11b formed on seed layer 10 along sidewalls 9a, 9b of the sensor structure. Depending on device design requirements, the total thickness of hard bias layer 11 is between 50 and 400 Angstroms. In this embodiment, the thickness of each sub-layer 11a, 11b may be from 25 to 200 Angstroms. The seed layer 10 is treated with a mild etch to form a higher density of nucleation sites at a surface 10s as described previously. Thereafter, a first hard bias sub-layer 11a is deposited on the etched seed layer to form an interface along top surface 10s. Then, the first sub-layer is treated with a mild etch to form a surface 11s having an increased number of nucleation sites compared to the sub-layer 11a surface before treatment. A second sub-layer 11b is deposited in the following step and thereby creates an interface between the first sub-layer and the second sub-layer along top surface 11s. As a result, a smaller average grain size is induced in sub-layers 11a, 11b than would otherwise be formed by a conventional deposition process because of the effect of the increased number of nucleation sites along surfaces 10s, 11s, respectively.

Smaller grain size leads to a higher Hcr than formed in a hard bias structure of similar thickness and elemental composition where no mild etching is applied. As shown in Table 1, there is a higher Hcr in a 250 Angstrom thick CoPt hard bias layer formed on a CrTi seed layer according to the first embodiment (row 2) than in the same thickness of CoPt hard bias layer formed by a prior art process (row 1). A comparison of results obtained from a hard bias structure generated by the second embodiment (row 3) and the first embodiment (row 2) demonstrate that as the number of mild etching steps and number of hard bias sub-layers increases during formation of a 250 Angstrom thick CoPt hard bias layer, the Hcr also increases. This observation is further confirmed by the results in rows 4 and 5 of Table 1 where Hcr is shown to increase to as high as 2500 to 3000 Oe by incorporating six or more hard bias sub-layers and mild etching steps in the hard bias layer fabrication sequence.

In Table 1, the value following each layer is the thickness in Angstroms. For the CrTi seed layer and all but the top CoPt layer in each stack, the thickness values are given prior to a subsequent mild etching step. Thus, the thickness of the CrTi40 seed layer is estimated to shrink to 30 to 35 Angstroms following a mild etching process. Similarly, the thickness of a CoPt140 sub-layer (row 3), each CoPt55 sub-layer (row 4), and each CoPt45 sub-layer (row 5) is expected to decrease by up to 15 Angstroms following a mild etching treatment. Thus, when one accounts for a 15 Angstrom thickness loss for each of the CoPt hard bias sub-layers etched in Table 1, the thickness of the composite hard bias layers in rows 3, 4, and 5 remains constant at about 250 Angstroms. The CoPt composition used in this study has an 80 atomic % Co and 20 atomic % Pt content. There was no annealing of the stack following deposition of all the layers.

TABLE 1

Effect of mild etching on CrTi/CoPt hard bias structures

| Row | Hard bias configuration | # Etch treatments | Hcr (Oe) |
| --- | --- | --- | --- |
| 1 | CrTi30/CoPt250 (reference) | none | 2200 |
| 2 | CrTi40/etch/CoPt250 | one | 2300 |
| 3 | CrTi40/etch/CoPt140/etch/CoPt125 | two | 2350 |
| 4 | CrTi40/etch/[CoPt55/etch] × 5/CoPt50 | six | 2500 |
| 5 | CrTi40/etch/[CoPt45/etch] × 7/CoPt40 | eight | 3000 |

Figure 4:
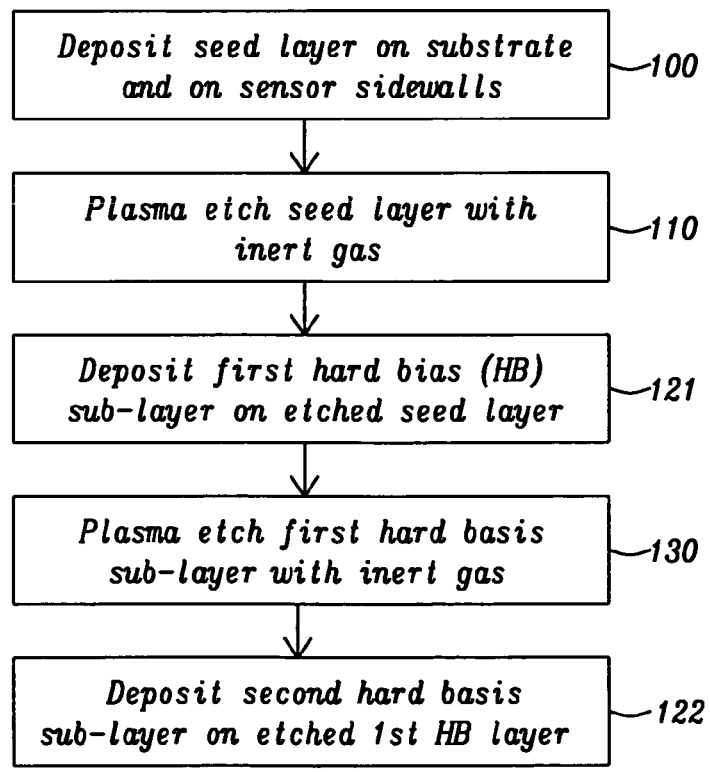
FIG. 4 is a flow chart illustrating a process sequence for depositing a seed layer and a hard bias layer comprised of a plurality of sub-layers according to a second embodiment of the present invention.

A process flow diagram for the second embodiment is illustrated in FIG. 4. Steps 100 and 110 are followed as in FIG. 2. Thereafter, in step 121, the first hard bias sub-layer is deposited by an IBD or sputter deposition process. In step 130, the first hard bias sub-layer is mildly etched by a process that may comprise the same conditions as described previously for the seed layer etch. In one aspect, a top portion about 10 to 15 Angstroms thick of the first hard bias sub-layer is removed during step 130 to provide a surface having an increased number of nucleation sites. During step 122, the second hard bias sub-layer is deposited on the etched first hard bias sub-layer. The increased number of nucleation sites on the surface of the etched first sub-layer is responsible for promoting a smaller average grain size in the second hard bias sub-layer formed in step 122, especially in a lower portion of the second sub-layer formed along the interface with the first hard bias sub-layer. All of the deposition and mild etching steps may be performed in the same IBD chamber to optimize throughput.

From a high resolution TEM cross-sectional view (not shown), a first interface between the seed layer and first hard bias sub-layer, and a second interface between the first hard bias sub-layer and second hard bias sub-layer can be identified by one skilled in the art. Further, a skilled artisan can observe a smaller average grain size in a CoPt hard bias layer with first and second sub-layers as described herein than in an equivalent thickness of a CoPt hard bias layer formed by a conventional method.

In yet another embodiment (not shown), there is a plurality of "n" hard bias sub-layers in hard bias layer 11. Furthermore, the seed layer 10 and each of the first "n−1" hard bias sub-layers are treated with a mild etch process as described previously before an overlying hard bias sub-layer is deposited. For example, a first sub-layer is treated with a mild etch before the second sub-layer is deposited, the second sub-layer is treated with a mild etch prior to depositing the third sub-layer, and so forth. Finally, the "nth" sub-layer is deposited on an "n−1"th sub-layer that has been mildly etched. Obviously, as "n" becomes larger than about 6 to 8, the throughput for forming the hard bias structure decreases somewhat and the cost associated with additional processing may become greater than the benefit realized from increased Hcr. All of the "n" mild etching and deposition steps may be performed in the same IBD chamber to optimize throughput. It should be noted that the present invention may also include an annealing process comprised of subjecting the hard bias structure to a temperature between 200° C. and 250° C. for 2 to 10 hours after the "nth" sub-layer is deposited. In some cases, Hcr is increased by an additional amount above the values reported in Table 1 when an annealing process is included in the fabrication sequence.

The present invention also encompasses a sensor stack (not shown) having sidewalls that extend into an underlying gap layer. Thus, the thickness of the gap layer below the sensor stack is greater than in regions that are not below the sensor stack. Alternatively, the sensor sidewalls may be extended into an underlying gap layer or bottom shield during the same etch sequence that forms sidewalls on sensor stack (layers 3-8) and before seed layer 10 is deposited as appreciated by those skilled in the art. Extension of the sidewalls into the gap layer or a bottom shield results in a larger region of hard bias layer 11 with stabilizing magnetization near the sidewalls 9a, 9b thereby increasing the HB field for biasing the free layer 7.

In summary, we have disclosed a method for fabricating a hard bias structure with enhanced Hcr that enables improved stabilization of an adjacent free layer in a sensor stack. The hard bias structure takes advantage of a smaller hard bias average grain size formed along an etched seed layer/hard bias layer interface. Additional improvement in hard bias properties is realized by forming a plurality of hard bias sub-layers in which each sub-layer except the uppermost sub-layer is formed on a seed layer or hard bias sub-layer surface that has been mildly etched to create an increased number of nucleation sites with higher surface energy than surrounding regions. All of the improvements noted herein may be accomplished with existing seed layer and hard bias layer materials used in the art and without changing the thickness of the seed layer and hard bias layer. Therefore, improved sensor performance is achieved at a cost similar to current fabrication schemes.

While this invention has been particularly shown and described with reference to, the preferred embodiment thereof, it will be understood by those skilled in the art that various changes in form and details may be made without departing from the spirit and scope of this invention.

We claim:

1. A method of forming a hard bias structure for providing longitudinal bias to stabilize a free layer in an adjacent magnetoresistive (MR) sensor, comprising:

(a) providing a substrate with a MR sensor formed thereon, said MR sensor includes a free layer, a top surface, and sidewalls connecting said top surface to the substrate, the sidewalls include exposed portions of the free layer;

(b) depositing a seed layer by a magnetron sputtering or an ion beam deposition (IBD) process along the sidewalls of the MR sensor and on regions of the substrate adjacent to said sidewalls;

(c) performing a plasma etch with an ion beam having a beam angle of 0 degrees with respect to a plane that is perpendicular to a plane of the substrate, an ion beam voltage of about 100 to 300 volts, and a beam current between 50 and 200 milli-Amps for a period of about 10 to 30 seconds to treat the seed layer and thereby create an increased number of nucleation sites thereon, and to remove a certain thickness of the seed layer; and (d) depositing a hard bias layer on the etched seed layer.

2. The method of claim 1 wherein the seed layer is comprised of Ti, CrTi, Cr, CrMo, CrV, CrW, or TiW, and has a deposited thickness between about 10 and 100 Angstroms.

3. The method of claim 1 wherein the hard bias layer is comprised of CoPt or CoCrPt, and has a thickness between about 50 and 400 Angstroms.

4. The method of claim 1 wherein the plasma etch to treat the seed layer is comprised of an Ar flow rate of about 5 to 10 sccm.

5. The method of claim 1 further comprised of annealing the hard bias structure after the hard bias layer is deposited with a process comprising heating between about 200° C. and 250° C. for a period of about 2 to 10 hours.

6. The method of claim 1 wherein the seed layer deposition, the hard bias layer deposition, and the plasma etch are all performed in the same IBD chamber.

7. The method of claim 4 wherein the seed layer has a deposited thickness that is reduced by about 5 to 10 Angstroms during the plasma etch.

8. A method of forming a hard bias structure including a hard bias layer comprised of a plurality of sub-layers for providing longitudinal bias to stabilize a free layer in an adjacent magnetoresistive (MR) sensor, comprising:

(a) providing a substrate with a MR sensor formed thereon, said MR sensor includes a free layer, a top surface, and sidewalls connecting said top surface to the substrate, the sidewalls include exposed portions of the free layer;

(b) depositing a conformal seed layer by a magnetron sputtering or an ion beam deposition (IBD) process along the sidewalls of the MR sensor and on regions of the substrate adjacent to said sidewalls;

(c) performing a first plasma etch with an ion beam having a beam angle of 0 degrees with respect to a plane that is perpendicular to a plane of the substrate, an ion beam voltage of about 100 to 300 volts, and a beam current between 50 and 200 milli-Amps for a period of about 10 to 30 seconds to treat the conformal seed layer and thereby create an increased number of nucleation sites thereon, and to remove a certain thickness of the conformal seed layer;

(d) depositing a first hard bias sub-layer on the etched conformal seed layer to form an interface between the first hard bias sub-layer and etched conformal seed layer;

(e) performing a second plasma etch with an ion beam having a beam angle of 0 degrees with respect to a plane that is perpendicular to a plane of the substrate, an ion beam voltage of about 100 to 300 volts, and a beam current between 50 and 200 milli-Amps for a period of about 10 to 30 seconds to treat the first hard bias sub-layer and thereby create an increased number of nucleation sites thereon, and to remove a certain thickness of the first hard bias sub-layer; and (f) depositing a second hard bias sub-layer on the etched first hard bias sub-layer.

9. The method of claim 8 further comprising formation of one or more hard bias sub-layers on the second hard bias sub-layer by repeating the following process one or more times;

(a) performing a plasma etch to treat an uppermost hard bias sub-layer; and (b) depositing a hard bias sub-layer on the etched uppermost hard bias sub-layer.

10. The method of claim 8 wherein the conformal seed layer is comprised of Ti, CrTi, Cr, CrMo, CrV, CrW, or TiW, and has a thickness between about 10 and 100 Angstroms.

11. The method of claim 8 wherein each of the plurality of hard bias sub-layers is comprised of CoPt, CoCrPt, and the hard bias layer has a thickness from about 50 to 400 Angstroms.

12. The method of claim 8 wherein the plasma etch to treat the conformal seed layer and the plasma etch to treat the first hard bias sub-layer are at an Ar flow rate of about 5 to 10 sccm.

13. The method of claim 8 further comprised of annealing the hard bias structure after the first and second hard bias sub-layer depositions are completed with a process comprising heating between about 200° C. and 250° C. for a period of about 2 to 10 hours.

14. The method of claim 8 wherein the conformal seed layer deposition, the first and second hard bias sub-layer depositions, the first plasma etch to treat the conformal seed layer, and the second plasma etch to treat the first hard bias sub-layer are performed in the same IBD chamber.

15. The method of claim 8 wherein the seed layer has a deposited thickness that is reduced by about 5 to 10 Angstroms during the plasma etch to treat the conformal seed layer.

16. The method of claim 8 wherein the first hard bias sub-layers has a deposited thickness that is reduced by up to about 15 Angstroms during the first plasma etch.

17. The method of claim 8 wherein each of the plurality of hard bias sub-layers is comprised of CoPt in which the Co content is about 80 atomic % and the Pt content is about 20 atomic %.

* * * * *